United States Patent
Kejariwal et al.

(10) Patent No.: US 6,466,091 B1
(45) Date of Patent: Oct. 15, 2002

(54) HIGH ORDER MULTI-PATH OPERATIONAL AMPLIFIER WITH REDUCED INPUT REFERRED OFFSET

(75) Inventors: Murari Kejariwal, Austin, TX (US); Prasad Ammisetti, Austin, TX (US); Axel Thomsen, Austin, TX (US)

(73) Assignee: Cirrus Logic, Inc.

(*) Notice: Subject to any disclaimer, the term of this patent is extended or adjusted under 35 U.S.C. 154(b) by 36 days.

(21) Appl. No.: 09/678,160

(22) Filed: Oct. 2, 2000

(51) Int. Cl.[7] ................................................ H03F 3/68
(52) U.S. Cl. ........................ 330/144; 330/150; 330/151
(58) Field of Search ............................ 330/9, 144, 150, 330/151, 306

(56) References Cited

U.S. PATENT DOCUMENTS

| | | |
|---|---|---|
| 3,989,961 A | 11/1976 | Masreliez |
| 3,991,730 A | 11/1976 | Crall |
| 4,318,613 A | 3/1982 | Waiwood |
| 4,328,465 A * | 5/1982 | Takaoka et al. ............ 330/151 |
| 4,384,257 A | 5/1983 | Nola |
| 4,429,281 A | 1/1984 | Ito et al. |
| 4,502,020 A | 2/1985 | Nelson et al. |
| 4,509,037 A | 4/1985 | Harris |
| 4,559,502 A | 12/1985 | Huiising |
| 4,559,634 A | 12/1985 | Hochschild |
| 4,628,279 A | 12/1986 | Nelson |
| 4,713,628 A | 12/1987 | Nelson |
| 4,757,270 A | 7/1988 | Rokos |
| 4,757,275 A | 7/1988 | Saller et al. |
| 4,766,367 A | 8/1988 | Saller et al. |
| 4,780,689 A | 10/1988 | Saller et al. |
| 4,808,942 A | 2/1989 | Milkovic |
| 4,906,944 A | 3/1990 | Freking |
| 4,924,189 A | 5/1990 | Senn et al. |
| 4,926,178 A | 5/1990 | Mallinson |
| 4,939,516 A | 7/1990 | Early |
| 4,994,805 A | 2/1991 | Dedic et al. |
| 5,012,244 A | 4/1991 | Wellard et al. |
| 5,298,813 A | 3/1994 | Tanigawa et al. |
| 5,317,277 A | 5/1994 | Cavigelli |
| 5,446,405 A | 8/1995 | Ikeda |
| 5,451,901 A | 9/1995 | Welland |
| 5,477,481 A | 12/1995 | Kerth |
| 5,635,871 A | 6/1997 | Cavigelli |
| 5,798,664 A | 8/1998 | Nagahori et al. |
| 6,002,299 A * | 12/1999 | Thomson ...................... 330/9 |

FOREIGN PATENT DOCUMENTS

EP 736968 A3 10/1997

OTHER PUBLICATIONS

Sergio Pernici et al., A CMOS Low–Distortion Fully Differential Power Amplifier with Double Nested Miller Compensator, IEEE Journal of Solid–State Circuits, vol. 28, No. 7, Jul. 1993, pp. 758–763.

(List continued on next page.)

Primary Examiner—Steven J. Mottola
(74) Attorney, Agent, or Firm—James J. Murphy, Esq.; Winstead Sechrest & Minick

(57) ABSTRACT

Disclosed in this application is the placement of an additional integrator between the first stage integrator output and the input to the attenuator/low pass filter. This approach reduces the input referred offset by a factor equal to the gain of the additional integrator, and the offset of the additional integrator itself will be divided by the gain of the first-stage integrator.

9 Claims, 1 Drawing Sheet

OTHER PUBLICATIONS

Rudy G.H. Eschauzier et al., Frequency Compensation Techniques for Low–Power Operational Amplifiers, Kluwer Academic Publishers, 1995, pp. 166–173.

Rudy G.H. Eschauzier et al., A 100 MhZ 100–dBOperational Amplifier with Multipath Nested Miller Compensation Structure, IEEE Journal of Solid–State Circuits, vol. 27, No. 12, Dec. 1992, pp. 1709–1716.

Paulic Yu et al. A high–Swing 2–V CMOS Operational Amplifier with Replica–Amp Gain Enhancement, IEEE Journal of Solid–State Circuits, vol. 28, No. 12, Dec. 1993, pp. 1265–1271.

Frank N. L. Op'T Cynde, A CMOS Large–Swing Low Distortion Three–Stage Class AB Power Amplifier, IEEE Journal of Solid–State Circuits, vol. 25, No. 1, Feb. 1990, pp. 265–273.

Wai Lang Lee, A Novel Higher Order Interpolative Modulator Topology for Higher Resolution Oversampling and Converters, Master's Thesis, Massachusetts institute of Technology, Jun. 1987, pp. 1–135.

Wai L. Lee, A Topology for Higher Order Interpolative Coders, IEEE, 1987, pp. 459–462.

Floyd M Gardner, Phaselock Techniques, 2nd Edition, Wiley–Interscience, 1979, pp. 16–25.

Ralph J. Schwarz et al., Linear Systems, McGraw–Hill Book Co., 1965, pp. 422–429.

Alan B. Grebene, Analog Integrated Circuit Design, Van Nostrand Reinhold Company, 1972, pp. 155–170.

Kuo–Chiang Hsieh et al., A low–Noise Chopper–Stabilized Differential Switched–Capacitor Filtering Techniquue, IEEE Journal of Solid–State Circuits, vol. SC–16, No. 6, Dec. 1981, pp. 708–715.

Irui Menk et al., Discrete–Time Feedback Structures for High Precision Analog Signal Processing, IEEE Transactions on Circuits and Systems–II: Analog and Digital Signal Processing, vol. 43, No. 1, Jan. 1996, pp. 60–62.

Christian C. Enz et al., Circuit Techniques for Reducing the Effects of Op–Amp Imperfections: Autozeroing Correlated Double–Sampling and Chopper Stabilization, Proceedings of the IEEE, vol. 84, No. 11, Nov. 1996, pp. 1584–1614.

Steven R. Norsworth et al., Delta–Sigma Data Converters Theory, Design and Stimulation, IEEE Press, 1997, pp. 183–185.

Sergio Franco, Design with Operational Amplifiers and Analog Integrated Circuits, McGraw–Hill Book Company, 1988, pp. 264–291.

Fan You et al., A Multistage Amplifier Topology with Nested Gm–C Compensation for Low–Voltage Application, ISSCC, Feb 8, 1997, pp. 2–3.

National Semiconductor, Topics on Using the LM6181–A New Current Feedback Amplifier, National Semiconductor, Application Note 813, Mar. 1992, pp. 1–10.

* cited by examiner

HIGH ORDER MULTI-PATH OPERATIONAL AMPLIFIER WITH REDUCED INPUT REFERRED OFFSET

INCORPORATION BY REFERENCE

The following commonly-assigned patents and patent applications are hereby incorporated by reference in herein:

U.S. Pat. No. 6,002,299, issued Dec. 14, 1999 to Thompsen, et al.

FIELD OF THE INVENTION

The invention relates to conditionally-stable high order multi-path operational amplifiers.

SUMMARY

An operational amplifier is a relatively high gain amplifier capable of being used in various kinds of feedback circuits. An operational amplifier circuits can, for example, provide programmable gain, signal summation, integration, and differentiation, and various other useful functions.

The most popular variety of operational amplifier has high-impedance differential signal inputs and a low impedance signal output, and functions as a high-gain differential voltage amplifier. Another kind of operational amplifier, known as an "operational transconductance amplifier," has high-impedance differential signal inputs and a high-impedance signal output, and functions as a differential voltage to current converter.

An amplifier is disclosed including multiple integrator stages. The multiple-stage amplifier includes an attenuator/low-pass filter, which serves to condition the signal passing through the amplifier. This attenuator/low pass filter is in the low frequency or DC path, it can cause the offset in the second stage integrator to be multiplied by the attenuation factor of the attenuator or low-pass filter, when referred to the output of the first-stage integrator. This multiplied offset, when input referred, can be a dominant contributor to the overall offset of the amplifier.

Disclosed in this application is the placement of an additional integrator between the first stage integrator output and the input to the attenuator/low pass filter. This approach reduces the input referred offset of the second stage integrator by a factor equal to the gain of the additional integrator, and the offset of the additional integrator itself will be divided by the gain of the first-stage integrator.

DETAILED DESCRIPTION OF THE EMBODIMENTS

Figure 1:
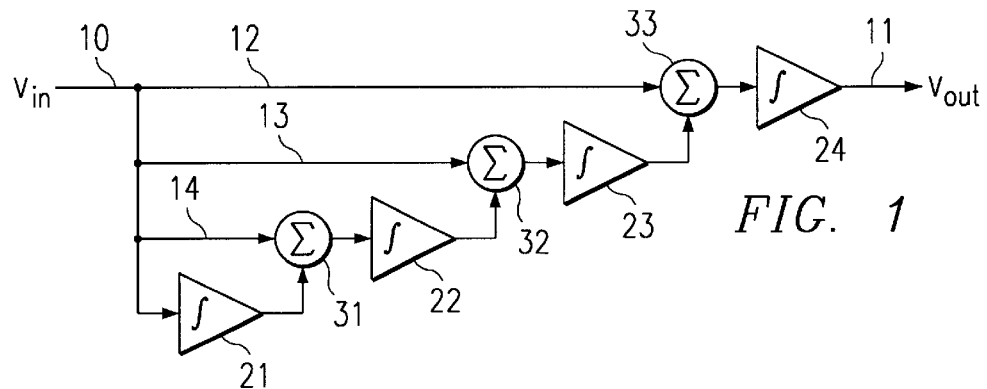
FIG. 1 is a schematic of a high order multi-path operational amplifier.

FIG. 1 is a schematic of a high order multi-path operational amplifier from a signal input 10 to a signal output 11. The operational amplifier has a low-frequency path including a series of integrator stages 21, 22, 23, and 24, and summers 31, 32, and 33. Each of the stages 21, 22, 23, and 24 functions as an integrator over some frequency range below the frequency at which the operational amplifier has unity gain. The operational amplifier has a high-frequency path including a high-frequency bypass path 12, the summer 33, and an output stage, which is the stage 24. The high-frequency path provides stability, and the low-frequency path provides large gain over a certain bandwidth.

The key building block of a multi-path operational amplifier is an integrator and an associated bypass path, such as the first stage integrator 21, bypass path 14, and summer 31. Such a building block has a transfer function given by $[H=1+\omega_1/\omega j]$. The term $\omega_1/\omega j$ is due to the integrator itself. The integrator provides a 90-degree phase lag and a power gain roll-off of 20 dB per decade. The frequency $\omega_1$ is the unity gain frequency for the first stage integrator 21.

Substantially above the unity gain frequency $\omega_1$ the bypass path 14 dominates the sum from the summer 31, and the phase is reduced to substantially zero. The building block, therefore, provides a means for reducing the phase lag of the open-loop frequency response of the operational amplifier in a transition region just below the critical frequency $\omega_1$.

In general, a variety of circuit topologies are possible using the above building block. A particular circuit topology can be synthesized from the key building block. The starting point for developing the circuit topology is to build an output stage 24. The output stage 24 is a single integrator structure, and it sets the unity gain bandwidth. The output stage 24 can be a traditional operational amplifier design such as a single stage amplifier, a Miller-compensated two-stage amplifier, a current feedback amplifier, or a more complex structure.

By connecting the basic block in series with the output stage 24, one obtains a second-order amplifier in which the integrator stage of the basic block is the input stage. To grow this second-order amplifier into a third-order system, the path into and/or out of the integrator stage of the basic block is replaced with another basic block. For example, the fourth-order amplifier of FIG. 1 can be synthesized by replacing the direct path from the signal input 10 into the integrator stage of the basic block with another basic block, to obtain a third-order amplifier, and again replacing the direct path from the signal input into the first integrator in the low-frequency path by a basic block, resulting in the fourth-order amplifier of FIG. 1. This fourth-order amplifier has a transfer function given by:

$$H(s)=(\omega_4/s)(1+\omega_3/s(1+\omega_2/s(1+\omega_1/s)))$$

The synthesis procedure can be repeated a number of times to create a system of any desired order. In a general system, the integrator stages will be ordered according to the sequence of stages in the low-frequency path, and the integrator stages will also have respective positions in a hierarchy according to how far each integrator stage is removed from the high-frequency path by other integrator stages. The output stage is at the top of the hierarchy.

Figure 2:
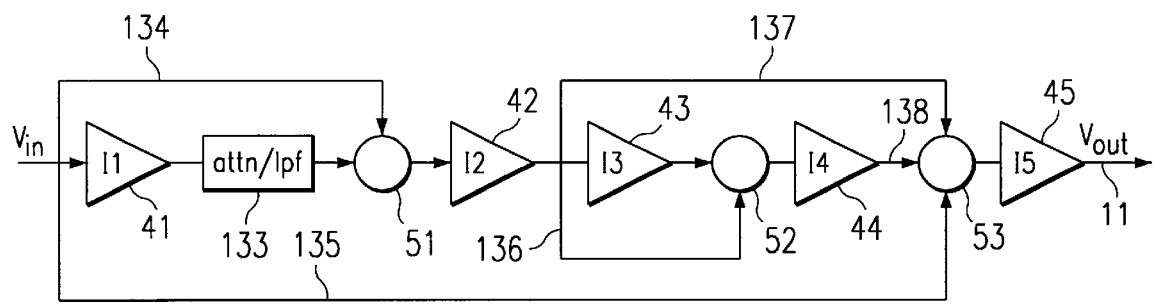
FIG. 2 is a schematic diagram of another architecture for a high order amplifier.

FIG. 2 is a schematic diagram of another architecture for a high order amplifier, which in this case has five integrator stages 41,42,43,44,45, and three summers 51,52,53. There is a low-frequency path including all five of the integrators 41–45 that is optimized for high gain, low noise, and low distortion. There are a number of higher-frequency paths 134,135,136,137 providing stability. Most of the power is consumed in the input stage 41 in order to reduce noise. Power consumption is reduced to some degree by using a relatively slow and relatively nonlinear output stage 45.

To obtain low noise in the input stage 41, the transistors in a differential amplifier of the input stage 41 can be physically large and have a very large transconductance. Although this large transconductance considerably reduces the effects of thermal noise, the 1/f noise is still significant. Moreover, the differential amplifier has a relatively large voltage offset. In order to reduce the 1/f noise and the voltage offset, the differential input stage may be chopper stabilized. Charge injection by the input chopper creates small input currents on the order of a few nanoamperes. Moreover, the chopping process creates an up-modulated offset waveform which is a square wave at the chopped frequency. A three-pole analog low-pass filter 133 having a bandwidth of 60 kHz, for example, can be used to attenuate these chopping artifacts. The low-pass filter 133 also has an attenuation factor of 1/64 at zero frequency, in order for the operational amplifier to have a desired degree of conditional stability. This rather high attenuation factor balances the high transconductance of the input transistors in the first stage differential amplifier. This rather high attenuation factor in turn sets a limit on the maximum amount of voltage offset that can be tolerated in the second stage integrator 42 without an objectionable shift in the quiescent voltage levels in the second stage integrator 42. Also, this attenuator multiplies the back-end offset voltage (mainly second stage integrator 42, offset voltage then gets divided by the gain of the first stage integrator 41, when input referred. This component can be the dominant contributor to the overall offset voltage) of the amplifier.

Figure 3:
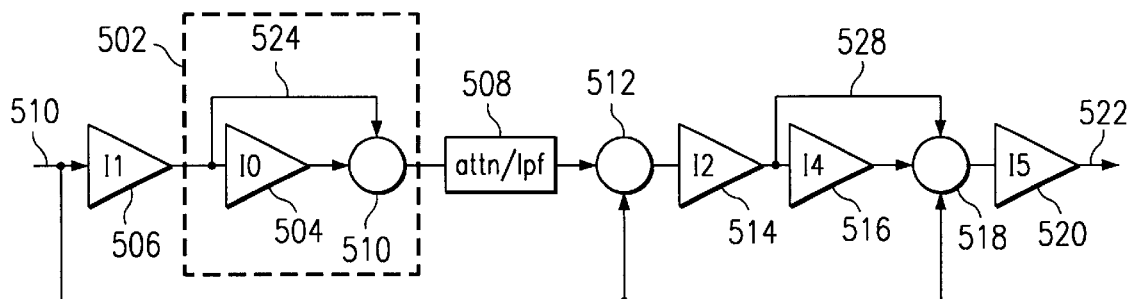
FIG. 3 is a schematic diagram of another embodiment of a high order amplifier.

The embodiment of FIG. 3 addresses the issue of the input-referred offset. This embodiment is similar to the embodiment of FIG. 2, and would accordingly have a similar gain/frequency (Bode plot) performance. The integrators of this embodiment have, however, been rearranged relative to the embodiment of FIG. 2. Specifically provided in this embodiment is another front-end integrator "I0," which is given the reference number 504, a high-frequency path 524, and a summer 510. By adding this additional integrator at the front end, before the attenuator/low-pass filter block 133, the eventual input-referred offset voltage at Vin in the closed-loop system will be divided by the gain of both the I0 and I1 integrator blocks 504, 506, whereas in FIG. 2, the input-referred offset voltage will be divided only by the gain of the I1 integrator block 41. Thus, in this embodiment, the back-end offset gets multiplied by the attenuation factor of the attenuator/low pass filter pf 508, and then gets divided by the gains of the I0 integrator block 504 and the I1 integrator block 506.

Still referring to FIG. 3, in this embodiment relative to the embodiment of FIG. 2, the I3 integrator block 43 (see FIG. 2) was eliminated because it was not needed to meet the design needs of the FIG. 3 embodiment. The elimination of this gain stage, and indeed the number of gain stages called for in any of the embodiments described in this application are a matter of design choice. The scope of the invention claimed should not be limited to any specific embodiment, but should be determined based upon the language of the claims which ultimately issue from this application.

A few preferred embodiments have been described in detail hereinabove. It is to be understood that the scope of the invention also comprehends embodiments different from those described, yet within the scope of the claims. Words of inclusion are to be interpreted as nonexhaustive in considering the scope of the invention.

Implementation is contemplated in discrete components or fully integrated circuits in silicon, gallium arsenide, or other electronic materials families, as well as in optical-based or other technology-based forms and embodiments. It should be understood that various embodiments of the invention can employ or be embodied in hardware, software or microcoded firmware. Summers can be implemented using operational amplifiers, wired connections, passive devices, electro-optic devices, integrated optic devices, acousto-optic devices or other implementations. Amplifiers can be discrete transistor amplifiers, operational amplifiers, optical amplifiers, traveling-wave-tube amplifiers, RF amplifiers, or other implementations. References in the claim preamble to "operational amplifiers" and to elements in the claims to "operational amplifier signal inputs or outputs should thus be construed broadly to cover other types of amplifiers, as the term "operational amplifier" has been used herein to distinguish from single-element amplifiers and thus to refer to any amplifier which may have subsidiary amplifying elements.

Bypass paths include hard-wired connections, RF connections, acoustic connections, or optical connections, and may include other elements interposed in the bypass paths. A given amplifier stage can include one or more than one sub-stages and/or one or more amplifying elements. A connection between amplifier stages or between other elements can include additional amplifiers or filtering elements, and therefore connections between elements recited in this application shall be inclusive of connections having additional elements interposed between such elements.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. An operational amplifier comprising:
   a) an operational amplifier signal input;
   b) an operational amplifier signal output;
   c) a first amplifier, said first amplifier having an input connected to said operational amplifier signal input and having an output;
   d) a second amplifier having an input connected to said output of said first amplifier and having an output;
   e) a first summer, said first summer having a first input connected to said output of said second amplifier, a second input, and an output;
   f) a first bypass signal path around said second amplifier, said bypass signal path connected at one end to the signal path between said first and second amplifiers and at the other end to said second input of said first summer;
   g) a signal attenuator having an input connected to said output of said first summer and having an output;
   h) a second summer, said second summer having a first input connected to said output of said signal attenuator, a second input, and an output; and
   i) a third amplifier having an input connected to said output of said second summer and having an output connected to said operational amplifier signal output.

2. The operational amplifier of claim 1 wherein said signal attenuator is a low-pass filter and an attenuator, combined.

3. The operational amplifier of claim 1 and further comprising a second bypass signal path around said first and second amplifiers and said signal attenuator, said bypass signal path connected at one end to the signal path between said operational amplifier signal input and said input to said first amplifier, and at the other end to a second input of said second summer.

4. The operational amplifier of claim 1 and further comprising at least the following elements interposed between said output of said third amplifier and said operational amplifier signal output:

a) a fourth amplifier having an input connected to said output of said third amplifier and having an output;

b) a third summer having an input connected to said output of said fourth amplifier, a second input, and an output; and c) a fifth amplifier having an input connected to said output of said third summer and an output connected to said signal output of said operational amplifier.

5. The operational amplifier of claim 4 and further comprising a second bypass signal path around said first and second amplifiers and said signal attenuator, said second bypass signal path connected at one end to the signal path between said operational amplifier signal input and said input to said first amplifier, and at the other end to said second input of said second summer.

6. The operational amplifier of claim 4 and further comprising a second bypass signal path around said first and second amplifiers, said first summer, said signal attenuator, said third amplifier, and said fourth amplifier, said second bypass signal path connected at one end to the signal path between said operational amplifier signal input and said input to said first amplifier, and at the other end to said second input to said third summer.

7. The operational amplifier of claim 6 wherein said third summer further comprises a third input, and further comprising a third bypass signal path around said fourth amplifier, said third bypass signal path connected at one end to the signal path between said third and fourth amplifiers and at the other end to said third input to said third summer.

8. An operational amplifier comprising:

a) an operational amplifier signal input;

b) an operational amplifier signal output;

c) a first amplifier, said first amplifier having an input connected to said operational amplifier signal input and having an output;

d) a second amplifier having an input connected to said output of said first amplifier and having an output;

e) a first summer, said first summer having a first input connected to said output of said second amplifier, a second input, and an output;

f) a first bypass signal path around said second amplifier, said bypass signal path connected at one end to the signal path between said first and second amplifiers and at the other end to said second input of said first summer;

g) a signal attenuator having an input connected to said output of said first summer and having an output;

h) a second summer, said second summer having a first input connected to said output of said signal attenuator, a second input, and an output;

i) a third amplifier having an input connected to said output of said second summer and having an output;

j) a fourth amplifier having an input connected to said output of said third amplifier and having an output;

k) a third summer having an input connected to said output of said fourth amplifier, a second input, and an output;

l) a second bypass signal path around said first and second amplifiers, said first summer, said signal attenuator, said third amplifier, and said fourth amplifier, said second bypass signal path connected at one end to the signal path between said operational amplifier signal input and said input to said first amplifier, and at the other end to said second input to said third summer; and m) a fifth amplifier having an input connected to said output of said third summer and an output connected to said operational amplifier signal output.

9. The operational amplifier of claim 8 and further comprising a second bypass signal path around said first and second amplifiers and said signal attenuator, said second bypass signal path connected at one end to the signal path between said operational amplifier signal input and said input to said first amplifier, and at the other end to a third input of said first summer.

* * * * *